United States Patent [19]

Heaviside

[11] 4,335,347
[45] Jun. 15, 1982

[54] POWER COMBINING OR DIVIDING ARRANGEMENTS

[75] Inventor: John W. Heaviside, Hurstpierpoint, England

[73] Assignee: The Marconi Company Limited, Chelmsford, England

[21] Appl. No.: 143,734

[22] Filed: Apr. 25, 1980

[30] Foreign Application Priority Data

Apr. 26, 1979 [GB] United Kingdom ............... 7914571

[51] Int. Cl.³ ........................................... H01Q 23/00
[52] U.S. Cl. ................................... 323/328; 333/131; 343/858
[58] Field of Search .................. 307/17, 83; 323/328; 333/100, 119, 131; 343/856, 858; 455/91, 116, 129

[56] References Cited

U.S. PATENT DOCUMENTS

| | | | |
|---|---|---|---|
| 3,109,998 | 11/1963 | Petts et al. | 307/17 X |
| 3,413,574 | 11/1968 | Schroeder | 333/119 |
| 3,428,920 | 2/1969 | Oleksiak | 333/100 X |
| 3,576,505 | 4/1971 | Seidel | 307/17 X |
| 3,845,392 | 10/1974 | Covill | 455/129 |

Primary Examiner—A. D. Pellinen
Attorney, Agent, or Firm—Spencer & Kaye

[57] ABSTRACT

An n-way power combining or dividing arrangement comprising n-transformers and n-input (combiner) or output (divider) terminals and n-balancing loads which are so arranged that the impedance at each input or output terminal remains substantially constant irrespective of the number of input terminals which are actively driven or, as the case may be, output terminals from which power is actively taken. Each input terminal is connected to one end of a respective one of the balancing loads, the other ends of which are connected together.

7 Claims, 1 Drawing Figure

U.S. Patent    Jun. 15, 1982    4,335,347
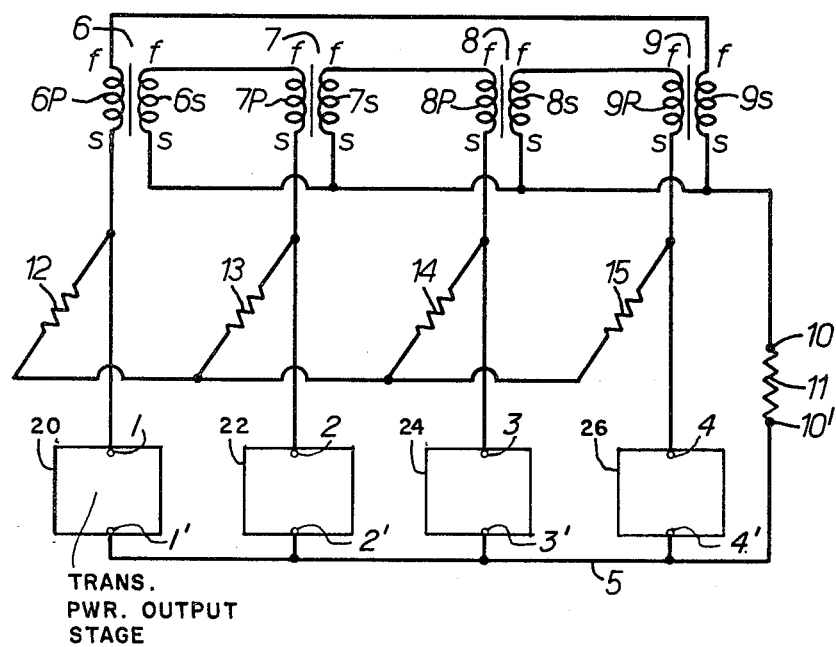

POWER COMBINING OR DIVIDING ARRANGEMENTS

This invention relates to power combining or dividing arrangements and more specifically to such arrangements in which a plurality of input electrical signals are required to be combined in order to feed a common load or in which an electrical signal is required to be divided into a plurality of separate electrical signals applied to respective output terminals.

A typical example of power combining arrangement with which the present invention is concerned will be one provided for use in a transmitter in order to combine the electrical outputs of a plurality of individual power output stages to feed a common load. Such combining units are of particular interest in the case of transistor trasmitters in view of the limited power handling capabilities of presently known power transistors.

Combining arrangements as at present proposed for such purposes tend to suffer from serious practical disadvantages. In some cases the loss of one of the driving stages results in a total interruption of the working of the transmitter whilst in others the loss of one driving stage results in a serious change in the output impedance seen by the remaining driving stages.

One object of the present invention is to provide an improved n-way combining arrangement particularly for use in a radio transmitter in which the above difficulties are mitigated.

The present invention also provideds an improved power divider unit.

According to this invention an n-way power combining or dividing arrangement comprises n-transformers and n-input (combiner) or output (divider) terminals and n-balancing loads so arranged that the impedance at each input terminal (combiner) or the lever at each output terminal (divider) remain substantially constant irrespective of the number of input terminals (combiner) which are actively driven or the number of output terminals (divider) from which power is actively taken.

According to a feature of this invention an n-way combining arrangement comprises an array of n-transformers the start of the primary winding of each of which is connected to a different one of n-input terminals and wherein the finish of each primary winding is connected (preferably directly) to the finish of the secondary winding of a different one of said transformers, the starts of all of the secondary windings are connected together and to an output terminal and each input terminal is connected to one end of a respective one of n-balancing loads the other ends of which are connected together.

According to another feature of this invention an n-way dividing arrangement comprises an array of n-transformers the start of the secondary winding of each of which is connected to a different one of n-output terminals and wherein the finish of each secondary winding is connected (preferably directly) to the finish of the primary winding of a different one of said transformers, the starts of all of the primary windings are connected together and to an input terminal and each output terminal is connected to one end of a respective one of n-balancing loads the other ends of which are connected together.

Each transformer should be a transformer of turns ratio 1:1 and preferably each transformer is a ferrite transformer.

The balancing loads should all be substantially equal to each other and to the input impedance of each input terminal.

According to a feature of this invention a radio transmitter is provided having a plurality of power output stages each of which is connected to a respective input terminal of a combining arrangement as described above, said output terminal of said combining arrangement being connected to provide a feed for an aerial.

Preferably each of said power output stages is a transistor power output stage.

The invention is illustrated in and further described with reference to the accompanying drawing which is a circuit diagram of one n-way power combining arrangement in accordance with the present invention.

Referring to the drawing the n-way combining arrangement illustrated has four input terminals referenced 1, 2, 3 and 4. Each of the input terminals 1, 2, 3 and 4 is formed as a pair with a terminal 1', 2', 3', or 4' which latter are connected to a common potential bus 5.

Four ferrite transformers, each of turns ratio 1:1, referenced 6, 7, 8 and 9 are provided with the start s of the primary winding 6P of transformer 6 connected to the input terminal 1; the start s of the primary winding 7P of transformer 7 connected to input terminal 2; the start s of the primary winding 8P of transformer 8 connected to input terminal 3 and the start s of the primary winding 9P of transformer 7 connected to input terminal 4.

The starts s of the secondary winding 6s of transformer 6 and the start s of the secondary winding 7s of transformer 7 and the start s of the seconary winding 8s of transformer 8 and the start s of the secondary winding 9s of transformer 9 are all connected together and to an output terminal 10. The output load is represented by a resistor 11 connected between output terminal 10 and terminal 10' which is connected to the common bus 5.

The finish of each of the primary windings 6P, 7P, 8P, and 9P is connected respectively to the finish of secondary windings 9s, 6s, 7s and 8s.

Input terminals 1, 2, 3 and 4 are connected respectively to one end of a different resistive balancing load 12 13, 14 and 15. The other ends of the balancing loads 12, 13, 14 and 15 are connected together. The balancing loads 12, 13, 14 and 15 are of values equal to one another and to the input impedance of each input terminal 1, 2, 3 and 4.

The n-way combining arrangement described above may now be considered employed to combine the n-transistor output stages of a transistorised radio transmitter for feeding a common aerial. The output of each transistor power output stage 20, 22, 24 and 26 would be connected to a respective one of the input terminals 1, 2, 3 and 4. The common aerial may be considered to be represented by the resistor 11. If now one of the transistor power output stages of the transmitter fails for any reason the input impedance seen by the remaining stages will stay substantially constant and the transmitter will thus continue to operate, albeit on reduced power.

The arrangement illustrated in the drawing in reversible so that it then becomes an n-way dividing arrangement rather than an n-way combining arrangement. Viewed as a dividing arrangement, terminal 10 becomes an input terminal; terminals 1, 2, 3, 4 become output terminals; windings 6s, 7s, 8s and 9s become primary windings and windings 6P, 7P, 8P and 9P become secondary windings.

I claim:

1. An n-way combining arrangement comprising an array of n-transformers the start of the primary winding of each of which is connected to a different one of n-input terminals and wherein the finish of each primary winding is connected to the finish of the secondary winding of a different one of said transformers, the starts of all of the secondary windings are connected together and to an output terminal and each input terminal is connected to one end of a respective one of n-balancing loads the other ends of which are connected together.

2. An arrangement as claimed in claim 1 and wherein each transformer is a ferrite transformer of turns ratio 1:1 and the balancing loads are all substantially equal to each other and to the input impedance of each input terminal.

3. An n-way arrangement comprising
n pairs of first terminals;
a pair of second terminals;
an array of n-transformers each having first and second windings, each of said first and second windings having a start and a finish, the start of the first winding of each of said n-transformers being connected to a corresponding one of said first terminals and the finish of each of said first windings being connected to the finish of a corresponding different one of said second windings, the start of each of said second windings being connected to one of said second terminals;
n-balancing load elements each having one end connected to a corresponding start of one of said first windings and a second end connected to a junction common to all of said elements; and
means connecting the other of all of said first pairs of terminals to the other of said second pair of terminals.

4. An arrangement as claimed in claim 3 wherein said n pairs of first terminals comprise input terminals, said pair of second terminals comprises output terminals, said first windings are primary windings of said transformers and said second windings are secondary windings of said transformers.

5. An arrangement as claimed in claim 3 or 4 wherein said balancing load elements have substantially equal impedances, and the input impedance of each of said elements is substantially equal to the impedance across each of said pairs of first terminals.

6. An arrangement as claimed in claim 1 or 4 wherein a power output stage of a transmitter having a plurality of said stages is coupled to each of said input terminals, and wherein an aerial is coupled to said output terminal.

7. An arrangement as claimed in claim 6 and wherein each of said power output stages is a transistor power output stage.

* * * * *